(12) United States Patent
Gondcharton et al.

(10) Patent No.: US 10,483,111 B2
(45) Date of Patent: Nov. 19, 2019

(54) METAL-METAL DIRECT BONDING METHOD

(71) Applicant: COMMISSARIAT A L'ENERGIE ATOMIQUE ET AUX ENERGIES ALTERNATIVES, Paris (FR)

(72) Inventors: Paul Gondcharton, Germigny L'exempt (FR); Bruno Imbert, Grenoble (FR); Hubert Moriceau, Saint-Egreve (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 186 days.

(21) Appl. No.: 15/650,175

(22) Filed: Jul. 14, 2017

(65) Prior Publication Data
US 2018/0019124 A1 Jan. 18, 2018

(30) Foreign Application Priority Data
Jul. 18, 2016 (FR) ...................... 16 56818

(51) Int. Cl.
*B23K 20/00* (2006.01)
*H01L 21/18* (2006.01)
(Continued)

(52) U.S. Cl.
CPC .......... *H01L 21/187* (2013.01); *B23K 20/002* (2013.01); *B23K 20/24* (2013.01);
(Continued)

(58) Field of Classification Search
CPC ........ H01L 2224/29147; H01L 21/187; B23K 20/24
See application file for complete search history.

(56) References Cited

U.S. PATENT DOCUMENTS

2012/0100657 A1* 4/2012 Di Cioccio ......... B81C 1/00269
438/51
2018/0297143 A1* 10/2018 Imbert .................. H01L 21/187

FOREIGN PATENT DOCUMENTS

WO 2016/059094 A1 4/2016

OTHER PUBLICATIONS

Search Report as issued in French Patent Application No. 1656818, dated Mar. 16, 2017.
(Continued)

*Primary Examiner* — Erin B Saad
(74) *Attorney, Agent, or Firm* — Pillsbury Winthrop Shaw Pittman LLP

(57) ABSTRACT

A method for assembling a first substrate and a second substrate by metal-metal direct bonding, includes providing a first layer of a metal at the surface of the first substrate and a second layer of the metal at the surface of the second substrate, the first and second metal layers having a tensile stress ($\sigma_i$) between 30% and 100% of the tensile yield strength ($\sigma_e$) of the metal; assembling the first and second substrates at a bonding interface by directly contacting the first and second tensile stressed metal layers; and subjecting the assembly of the first and second substrates to a stabilization annealing at a temperature lower than or equal to a temperature threshold beyond which the first and second tensile stressed metal layers are plastically compressively deformed.

16 Claims, 4 Drawing Sheets

(51) Int. Cl.
*B23K 20/24* (2006.01)
*B23K 31/02* (2006.01)
*H01L 23/00* (2006.01)
*H01L 33/00* (2010.01)

(52) U.S. Cl.
CPC ............ *B23K 31/02* (2013.01); *H01L 21/185* (2013.01); *H01L 24/05* (2013.01); *H01L 33/0079* (2013.01); *H01L 2224/056* (2013.01); *H01L 2224/05647* (2013.01); *H01L 2224/065* (2013.01); *H01L 2224/80097* (2013.01); *H01L 2224/80895* (2013.01)

(56) References Cited

OTHER PUBLICATIONS

Gondcharton, P., et al., "Effect of Copper-Copper Direct Bonding on Voiding in Metal Thin Films," Journal of Electronic Materials, vol. 44, No. 11, Sep. 2015, ISSN: 0361-5235, XP035540230, pp. 4128-4133.

Di Cioccio, L., et al., "An Overview of Patterned Metal/Dielectric Surface Bonding: Mechanism, Alignment and Characterization," Journal of the Electrochemical Society, 158 (6), (2011), pp. P81-P86.

Shen, Y. G., et al., "Residual stress, microstructure, and structure of tungsten thin films deposited by magnetron sputtering," Journal of Applied Physics, vol. 87, No. 1, Jan. 2000, doi: 10.1063/1.371841, pp. 177-187.

Timoshenko, S., "Analysis of Bi-Metal Thermostats," Journal of the Optical Society of America, vol. 11, Issue 3, (1925), pp. 233-255.

Hall, E. O., "The Deformation and Ageing of Mild Steel: III Discussion of Results," IOP Science, 1951, pp. 747-753.

Shen, Y.-L., et al., "Thermal Cycling and Stress Relaxation Response of Si—Al and Si—Al—SiO2 Layered Thin Films," Acta metal. Mater., vol. 43, No. 11, (1995), pp. 3915-3926.

Di Cioccio, L., et al., "Modeling and integration phenomena of metal-metal direct bonding technology," ECS Transactions, © The Electrochemical Society, 64 (5), (2014), 17 pages.

Hommel, M., et al., "Deformation Behavior of Thin Copper Films on Deformable Substrates," Acta mater., 49, (2001), pp. 3935-3947.

\* cited by examiner

METAL-METAL DIRECT BONDING METHOD

CROSS-REFERENCE TO RELATED APPLICATIONS

This application claims priority to French Patent Application No. 1656818, filed Jul. 18, 2016, the entire content of which is incorporated herein by reference in its entirety.

FIELD

The present invention relates to a metal-metal direct bonding method enabling two elements, such as substrates of semi-conductor materials, to be assembled.

BACKGROUND

Metal-metal bonding today finds many applications in the field of microelectronics or nanotechnologies. By way of example, it is used for encapsulating MEMS components, for making electrodes in photovoltaic cells and for making heat sinks in power components.

The metal bonding is also involved in the manufacture of three dimension integrated circuits (3D-IC), because it enables several semi-conductor substrates containing metal interconnections to be vertically stacked while ensuring electrical continuity between these interconnections. The assembled substrates generally have a metal/dielectric hybrid bonding surface, that is a substrate comprised of pads and/or metal lines surrounded by a dielectric material. The bonding thereby requires an alignment of the metal interconnections belonging to both substrates.

Several known metal bonding techniques enable two substrates to be assembled without introducing an intermediate compound—such as an adhesive, a wax or a low melting alloy—at the bonding interface.

By way of example, the direct (non thermo-compressive) bonding method of copper comprises contacting, generally at ambient temperature, two copper layers the surfaces of which are smooth, hydrophilic and free of contamination. In this case, the attractive forces between both copper layers (Van der Waals forces in particular) are sufficiently high to cause adhesion between both substrates. The assembly of both substrates is then subjected to a so-called stabilization post-bonding annealing to make bonding irreversible, mechanically robust and electrically conductive.

According to document ["An Overview of Patterned Metal/Dielectric Surface Bonding: Mechanism, Alignment and Characterization", L. Di Cioccio et al., Journal of The Electrochemical Society, No. 158, pp. 81-86, 2011], the direct bonding can be made in the air and at ambient temperature. Thereby, the presence of copper oxide layers is observed at the bonding interface. These copper oxide layers can be detrimental to the bonding quality, despite that copper oxide is thermally instable and disappears during the stabilization annealing. The direct bonding can also be achieved under ultra-high vacuum (UHV) to avoid the formation of copper oxide layers at the surface. However, pieces of equipment enabling an ultra-high vacuum to be created and maintained are particularly expensive and slow, which limits the use of this technique.

The direct bonding method at ambient temperature and pressure is simpler to implement than other metal bonding techniques, in particular the thermo-compression assisted copper bonding method. Further, the stabilization annealing is made at low temperature (about 300° C.), which avoids to worsen the properties of the components formed in the substrates. However, the quality of the direct bonding is dependent on the surface state of the copper layers before bonding. Chemical-mechanical polishing and washing steps are thus generally accomplished to improve this surface state.

The main drawback of the direct bonding highlighted by literature is the presence of defects after annealing, not only at the bonding interface between both copper layers, but also at the interfaces between each copper layer and the substrate on which the layer has been deposited. These defects are generally in the form of voids and dislocations. In the case of a 3D-IC integration, these defects cause in particular open lines (interconnection cut-out) or extrusion and then interconnection short-circuit phenomena.

Copper oxide residues can be responsible for a part of the defects at the bonding interface. However, as discussed in the paper ["Effect of Copper-Copper Direct Bonding on Voiding in Metal Thin Films", P. Gondcharton et al., Journal of Electronic Materials, Vol. 44, No. 11, pp. 4128-4132, 2015], the main origin of the other defects seems to be the mechanical stresses which are exerted in both contacting copper layers during the stabilization annealing. These mechanical stresses are due to the expansion coefficient difference between copper and the material of the substrates which support the copper layers (herein, silicon).

FIG. 1 shows the evolution of the in-plane biaxial stress $\sigma$ of two copper layers after being bonded, as a function of the temperature T of the stabilization annealing. The positive values of the stress $\sigma$ correspond to a tensile stress $\sigma$ and the negative values of the stress $\sigma$ correspond to a compressive stress.

The stabilization annealing corresponds to a heat cycle comprising a temperature rise (lower curve) from the ambient temperature (here 25° C.) up to a temperature of 300° C., and then a cooling (upper curve). The temperature rise consists of two successive phases P1 and P2. During the first phase P1 (25° C. to 100° C.), referred to as thermo-elastic phase, the stress $\sigma$ of the copper layers substantially linearly decreases (in relative value), up to reach the compressive yield strength of copper. This phase P1 is only governed by the heat expansion difference between the substrates (silicon) and the copper layers. During the second phase P2 (100° C.-300° C.), the stress $\sigma$ is maintained at the compressive yield strength. This plateau phase P2 corresponds to a plasticity regime of the copper layers, which accommodate the inner deformations by creep and void nucleation mechanisms. During this phase P2, defects are created at the interfaces with the copper layers. Finally, the third phase P3 corresponding to cooling is another thermo-elastic phase, where the stress $\sigma$ linearly increases, switching from a negative value (compressive stress) to a positive value (tensile stress).

SUMMARY

An aspect of the present invention is to limit the formation of defects, such as voids or dislocations, during the stabilization annealing of an assembly of two substrates by metal-metal direct bonding.

According to an aspect of the invention, this aim tends to be achieved by providing a method for assembling a first substrate and a second substrate by metal-metal direct bonding, comprising the following steps of:

providing a first layer of a metal at the surface of the first substrate and a second layer of the metal at the surface of the second substrate, the first and second metal layers having a tensile stress comprised between 30% and 100% of the tensile yield strength of the metal;

assembling the first and second substrates at a bonding interface by directly contacting the first and second tensile stressed metal layers; and subjecting the assembly of the first and second substrates to a stabilization annealing at a temperature lower than or equal to a temperature threshold beyond which the first and second tensile stressed metal layers are plastically compressively deformed.

The use of two metal layers having a tensile stress, prior to their direct contacting, enables the elasticity regime of these layers (in a bonding configuration) to be extended up to sufficiently high temperatures to make the stabilization annealing. By stabilization annealing, or post-bonding annealing, it is meant the heat treatment for making the bonding of two substrates irreversible, mechanically robust and electrically conductive. Thus, during the stabilization annealing, the plasticity regime of the metal layers, which is the major responsible for the defects at the interfaces between the metal layers and the substrates on the one hand, and at the bonding interface (i.e. between both metal layers) on the other hand, is minimized or even avoided.

According to a development of the invention, the assembling method further comprises a step of calculating the temperature threshold from the tensile stress of the first and second metal layers and the thermo-elastic coefficient of the metal.

In an embodiment of the assembling method, the tensile stress of the first and second metal layers is obtained after deposition during a stress adaptation step.

The stress adaptation step can comprise a heat treatment followed by a cooling, the heat treatment being performed at a temperature lower than or equal to a temperature limit beyond which the first and second metal layers are plastically tensile deformed by cooling, the temperature of the heat treatment then setting the temperature threshold of the stabilization annealing.

In an embodiment, the cooling is performed up to the ambient temperature.

The temperature of the stabilization annealing is equal to the temperature of the heat treatment.

Alternatively, the stress adaptation step is a step of plasma treatment or ion bombardment.

In an alternative embodiment, the tensile stress of the first and second metal layers is obtained during deposition of the first metal layer onto a face of the first substrate and of the second metal layer onto a face of the second substrate.

The assembling method according to one or more embodiments of the invention can also have one or more of the characteristics below, considered singly or according to any technically possible combination:

the assembly of the first and second substrates is performed under ambient air;

the assembly of the first and second substrates is performed at ambient temperature;

the first and second substrates are comprised of identical materials;

the first and second substrates are made of silicon and the first and second metal layers are made of copper;

the first and second metal layers have a thickness comprised between 10 nm and 5 μm;

the method further comprises before the step of assembling the first and second substrates, at least one step of preparing the surface of the first and second metal layers.

BRIEF DESCRIPTION OF THE FIGURES

Further characteristics and benefits of the invention will clearly appear from the description thereof that follows, by way of indicating and in no way limiting purposes, in reference to the appended figures, in which.

For more clarity, identical or similar elements are marked by identical reference signs throughout the figures.

DETAILED DESCRIPTION

Figure 1:
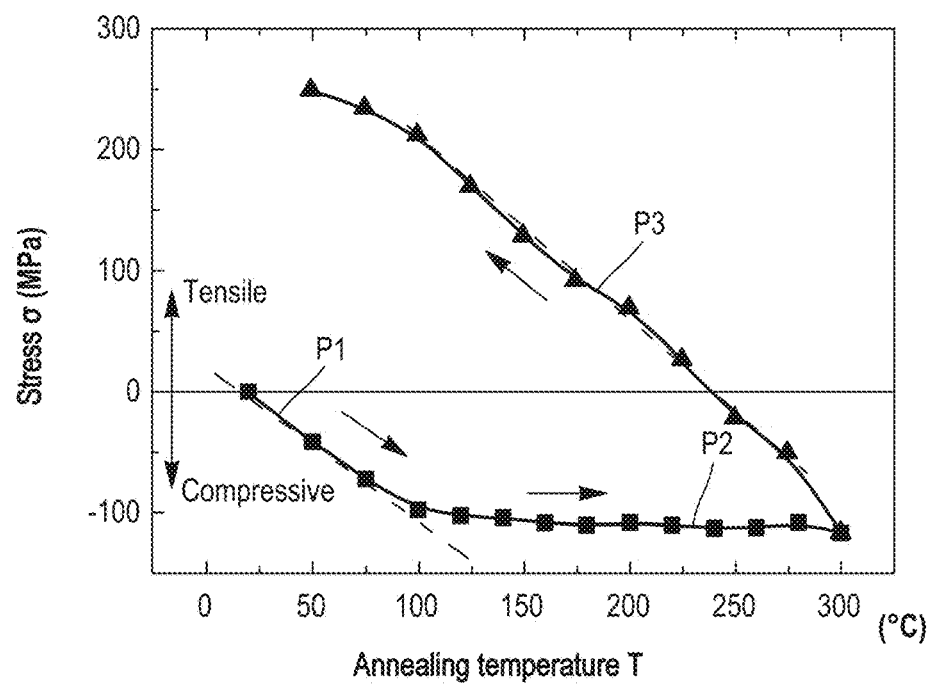
FIG. 1, previously described, represents the biaxial stress which is exerted in the plane of two metal layers directly bonded to each other during a stabilization annealing of the bonding.

By definition, the yield strength (or elastic limit) is the stress from which a material stops being elastically (or reversibly) deformed. From this stress, a permanent deformation appears. As illustrated in FIG. 1, a phase P2 thereby appears in which the stress varies less, or even becomes constant. In the following, this phase will be depicted by a plateau which will be called a "plasticity plateau".

In the description that follows, "$\sigma_p$" designates the compressive yield strength and "$\sigma_e$" designates the tensile yield strength.

Figure 2:
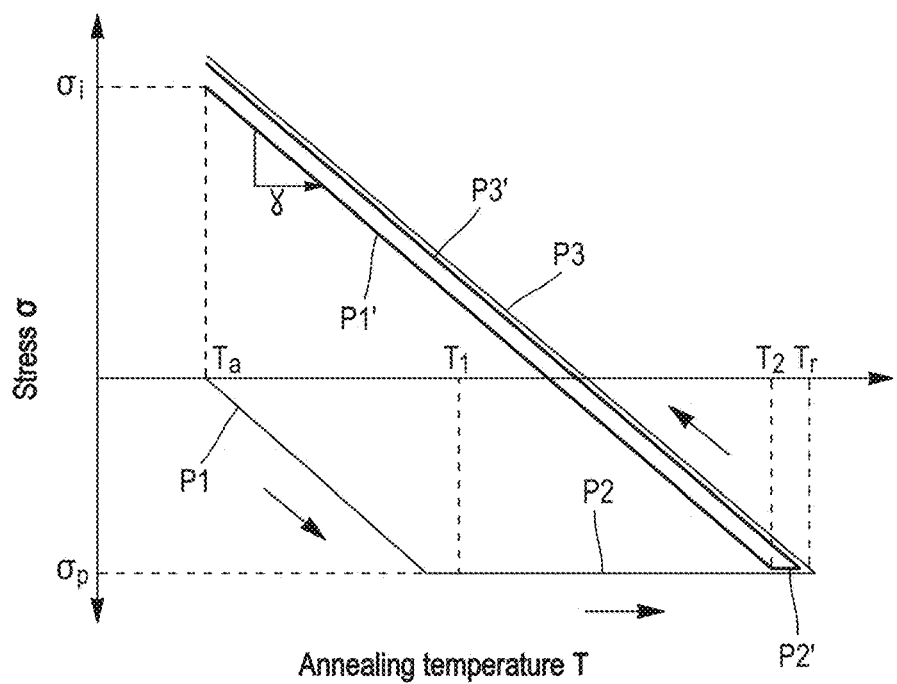
FIG. 2 schematically represents the same biaxial stress, in the case where a tensile pre-stress is applied to the metal layers and in the case of FIG. 1, where no pre-stress is applied.

FIG. 2 is a graph similar to that of FIG. 1 and represents the evolution of the in-plane biaxial stress σ of two metal layers as a function of the temperature T of a stabilization annealing. Both layers, formed by the same metal, have been bonded against each other before being subjected to the stabilization annealing.

FIG. 2 shows two heat cycles corresponding to two distinct cases. The first heat cycle, successively comprising the thermo-elastic phase P1, the plasticity plateau P2 and the thermo-elastic phase P3, corresponds to that represented in FIG. 1, that is the case of two metal layers having a zero stress before bonding (σ=0 at T=25° C., i.e. before annealing). The second heat cycle, successively comprising the thermo-elastic phase P1', the plasticity plateau P2' and the thermo-elastic phase P3', corresponds to the case of two metal layers which have been subjected to a tensile stress $\sigma_i$ before being bonded (σ=$\sigma_i$>>0 at T=25° C., i.e. before annealing). For each heat cycle, the plasticity plateau P2/P2' starts when the stress σ reaches the compressive yield strength $\sigma_p$ of the metal and ends at the set point temperature $T_r$ of the annealing. After some time at the set point temperature $T_r$, the annealing temperature T decreases. This cooling corresponds to the thermo-elastic phase P3/P3'.

It is noticed that the plasticity plateau P2' of the layers that have been tensile pre-stressed extends on a much lower temperature range than the plasticity plateau P2 of the layers having undergone no pre-stress. Indeed, the thermo-elastic phase P1' of the pre-stressed layers extends up to a temperature T2 much higher than temperature T1, where the thermo-elastic phase P1 of the non-stressed layers ends. The increase in the temperature T during the stabilization annealing being substantially constant over time, that means that the tensile pre-stressed metal layers will spend less time in plasticity regime (P2) than the layers having undergone no stress. Consequently, a lesser number of defects will be generated at the interfaces of the pre-stressed metal layers during the stabilization annealing.

The assembling method by metal-metal direct bonding according to the invention applies this principle to limit as much as possible defects generated during the stabilization annealing. The initial stress and the annealing conditions are chosen such that the metal layers, in a bonding configuration, avoid the plasticity plateau.

Figure 3:
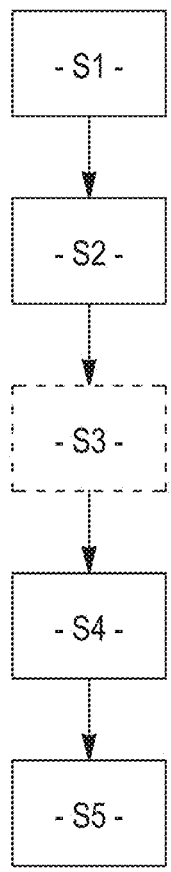
FIG. 3 represents steps of a method according to an embodiment of the invention for assembling two substrates by metal-metal direct bonding.

FIG. 3 represents steps S1 to S5 of this assembling method.

The first step S1 consists in providing two substrates each having a metal layer at the surface. The substrates can be semi-conductor wafers, for example based on silicon, a face of which is covered at least partially with a metal layer. These substrates can in particular have a hybrid bonding surface, comprised of metal interconnections (lines, pads) surrounded by a dielectric material, for example an oxide or a nitride (case of 3D integrated circuits in particular). Alternatively, their bonding surface can be fully metallic.

The metal layers present at the surface of both substrates are beneficially comprised of a same metal, in an embodiment, chosen from copper (Cu), gold (Au), nickel (Ni), molybdenum (Mo), palladium (Pd), aluminum (Al), silver (Ag), tungsten (W) and platinum (Pt). They can also be comprised of an alloy of these metals. The substrates can also be fully comprised of this metal or this alloy.

The surface of both substrates can also have several metal layers formed by different metals (chosen from those above-mentioned).

In an embodiment of step S1, a first metal layer is deposited onto a face of a first substrate and a second layer of the same metal is deposited onto a face of a second substrate. The material of the first substrate and the material of the second substrate can be chosen from silicon, sapphire (alumina), glass, quartz, silicon carbide (SiC), lithium niobate ($LiNbO_3$), lithium tantalite ($LiTaO_5$) and metals. They are, in an embodiment, identical to each other. The first and second metal layers are for example obtained by a physical vapor deposition (PVD) technique, such as evaporation or sputtering, by chemical vapor deposition (CVD) or electro-deposition (ECD).

Both metal layers are, in an embodiment, thin layers, whose the thicknesses are comprised between 10 nm and 5 µm. Thereby, they are more thermally stable and their uniformity could be retained during a subsequent stabilization annealing.

These metal layers can be directly stressed during deposition in order to obtain an initial tensile stress $\sigma_i$ between 30% (in an embodiment 50% or even 70%) and 100% of the tensile yield strength $\sigma_e$ of the metal. The initial tensile stress $\sigma_i$ of the metal layers is, in an embodiment, measured at ambient temperature $T_a$ (see FIG. 2), for example 25° C. It is lower than or equal to the tensile yield strength $\sigma_e$ because, beyond this limit, the metal layers are plastically deformed and can lose their integrity over time.

Alternatively, the assembling method of FIG. 3 comprises after the deposition S1 a step S2 of stressing both metal layers, for example by heat treatment, ion bombardment or plasma treatment.

As previously described in connection with FIG. 2, the tensile pre-stress obtained after deposition S1 or after step S2 enables the elasticity regime of the metal layers to be extended in a bonding configuration up to sufficiently high temperatures to perform a stabilization annealing of the bonding without a plastic deformation of the layers.

The method also beneficially comprises one or more steps of preparing the surface of the metal layers. This optional preparing step S3 can in particular have the purpose of decreasing the surface roughness of the metal layers and/or hydrophilising the surfaces to be assembled, in order to achieve a strong adhesion between both substrates during the metal-metal direct bonding. Step S3 comprises for example a chemical-mechanical polishing (CMP) of the free face of the metal layers. This polishing is beneficially followed by a washing, for example a wet washing, in order to remove residual particles generated by polishing. It can also comprise a plasma treatment.

This preparing step S3 is generally performed after step S2. For example, a chemical-mechanical polishing step is performed after stressing by heat treatment. Naturally, other alternative embodiments are possible. If a stressing is performed by a plasma treatment which preserves surface hydrophilicity, the CMP step can be performed before this plasma treatment. A CMP step (to adjust the surface roughness) and then a pre-stressing step and finally a chemical preparation step (to adjust the surface hydrophilicity) can also be considered.

During step S4, the first and second substrates are assembled by directly contacting the first and second metal layers. This direct bonding step can be performed under a controlled atmosphere, for example an inert gas ($N_2$) atmosphere or an anhydrous atmosphere, or under vacuum. In so far as the assembling method limits the formation of defects at the bonding interface by avoiding the plastic deformation of the metal layers, the direct bonding can also be performed under ambient air. The bonding is thereby simpler and less expensive to implement.

The direct bonding of step S4 can be manually achieved, in particular when it is performed at ambient temperature and under ambient air, or in an automated way in a dedicated piece of equipment. On the other hand, the bonding can require in some cases, as that of hybrid bonding surfaces (three dimension integrated circuits in particular), a prior alignment of the metal patterns belonging to the first substrate with those of the second substrate. Alignment and bonding are, in an embodiment, performed in the same piece of equipment.

Finally, in step S5, the assembly of both substrates is subjected to the stabilization annealing. The closer the initial tensile stress $\sigma_i$ is chosen to the tensile yield strength $\sigma_e$, the higher is the maximum allowable temperature for the stabilization annealing. By "maximum allowable temperature", it is meant the temperature threshold beyond which the pre-stressed metal layers are compressively plastically deformed, that is temperature T2 of FIG. 2.

The initial tensile stress $\sigma_i$ is, in an embodiment, comprised between 70% and 100%, and, in an embodiment, between 80% and 100%, of the tensile yield strength $\sigma_e$. Thus, the stabilization annealing can be achieved at a higher temperature, which widens the metal choice and/or ensures a better assembly.

The maximum allowable temperature of the stabilization annealing can be calculated from the initially chosen tensile stress $\sigma_i$ and the thermo-elastic coefficient $\gamma$ of the metal in the assembling configuration being used (the thermo-elastic coefficient $\gamma$, which represents the slope of the straight line $\sigma(T)$ during the first thermo-elastic phase P1', also depends of the nature of the substrates on which the metal layers are deposited). This maximum temperature is for example between 250° C. and 400° C. in the case of a copper layer deposited on a silicon substrate. Conversely, if the stabilization annealing should be made at a given temperature, the thermo-elastic coefficient $\gamma$ of the metal makes it possible to calculate the initial tensile stress $\sigma_i$ to be applied to the metal layers such that the elasticity regime ends at this temperature.

Figure 4A:
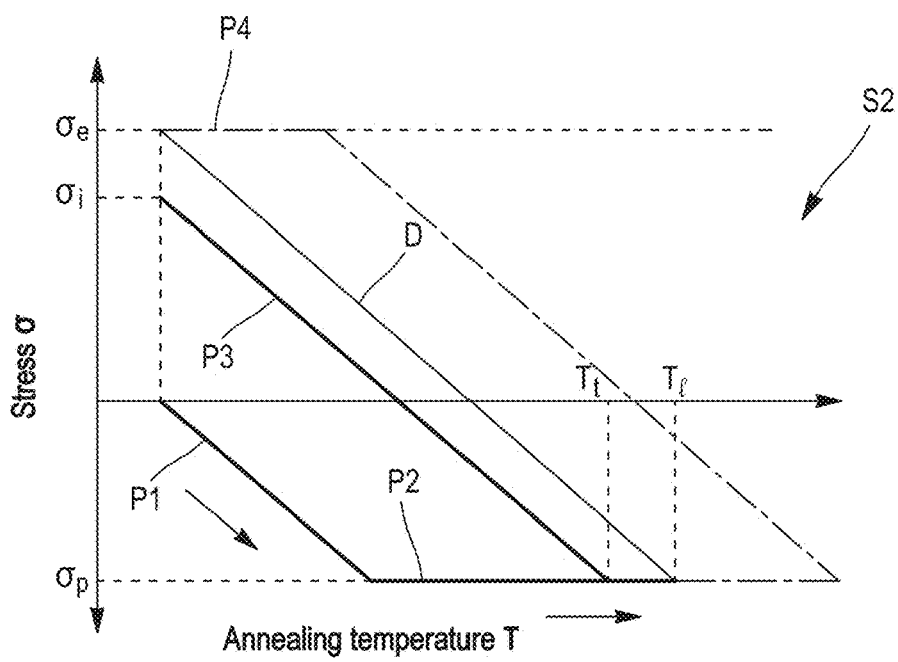
FIG. 4A represents the step of applying a tensile stress to both metal layers before contacting, according to an embodiment of the assembling method according to the invention.
Figure 4B:
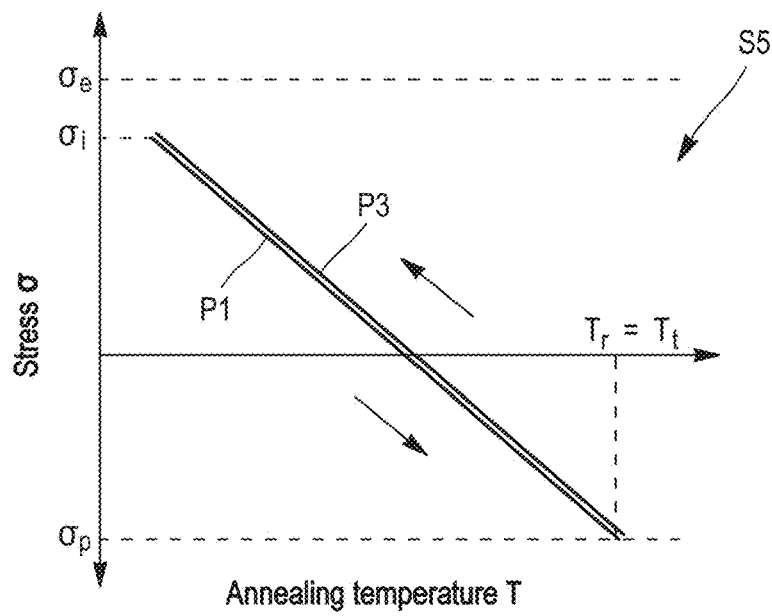
FIG. 4B represents the stabilization annealing step after contacting both metal layers, according to the embodiment of the method according to the invention.

FIGS. 4A and 4B respectively represent the pre-stressing step S2 and the stabilization annealing step S5 according to an embodiment of the assembling method.

In this embodiment, the initial tensile stress $\sigma_i$ is achieved by a pre-stress annealing, distinct from the stabilization annealing carried out in step S5 of the assembling method. FIG. 1 has previously shown that the stabilization annealing of prior art made it possible to switch from a zero stress to a tensile stress. The pre-stress annealing carried out in step S2 can thus be performed under the same conditions as the stabilization annealing of prior art, except that the metal layers will not be bonded yet.

Thus, the pre-stress annealing of the metal layers comprises a heat treatment, during which the temperature of the metal layers increases from ambient temperature $T_a$ to a set point temperature $T_t$, and then a cooling, in an embodiment, up to the ambient temperature $T_a$ (see FIG. 4A). The heat treatment comprises, much like the temperature rise of FIG. 1, a thermo-elastic phase P1 (up to reach the compressive yield strength $\sigma_p$ of the metal) and then the plasticity plateau P2 up to the set point temperature $T_t$.

During the pre-stress annealing, both metal layers are not in a bonding configuration, but in a free surface configuration. Thus, when they undergo the plasticity plateau P2, the metal layers can be freely deformed. The pre-stress annealing thus does not generate defects at the surface or inside the metal layers, unlike the stabilization annealing of prior art.

The cooling of the metal layers during the pre-stress annealing is fully performed in an elastic regime (thermo-elastic phase P3), such that the metal layers do not lose their integrity. Indeed, unlike the compression plasticity regime (plateau P2), the tensile plasticity regime P4 (FIG. 4A) degrades the metal layers, even when they are in a free surface configuration. The set point temperature $T_t$ of the heat treatment is thus lower than or equal to a temperature limit $T_l$ for which the stress of the metal layers at ambient temperature $T_a$ is equal to the tensile yield strength $\sigma_e$ of the metal ($\sigma=\sigma_e$, at $T=T_a=25°$ C.; see straight line D in FIG. 4A). Beyond this temperature limit $T_l$ (in chain dotted line in FIG. 4A), the metal layers will be plastically tensile deformed by cooling up to the ambient temperature (during cooling before bonding, during the post-bonding cooling or during the post-stabilization annealing cooling).

The temperature limit $T_l$ of the pre-stress annealing can be calculated from the tensile yield strength $\sigma_e$ of the metal and the thermo-elastic coefficient $\gamma$ of the metal (i.e. the slope of the straight line D in FIG. 4A).

The cooling thermo-elastic phase P3 during the pre-stress annealing can also be stopped at a temperature higher than the ambient temperature $T_a$, for example at 50° C. or 100° C. The direct bonding of step S4 is thereby performed at this temperature. It could be useful in this case to apply an external pressure (thermo-compression) to achieve bonding. Indeed, the surfaces after the pre-stressing heat treatment may no longer be sufficiently hydrophilic any longer to ensure direct bonding at ambient pressure.

The stabilization annealing S5 (after the direct bonding S4) is, in this embodiment, performed at a temperature $T_r$ lower than or equal to the set point temperature $T_t$ of the pre-stress annealing. In other words, the set point temperature $T_t$ of the pre-stress annealing sets the temperature threshold, or maximum allowable temperature, of the stabilization annealing.

Thus, the metal layers will not enter the compression plasticity regime P2 and the heat cycle only consists of the thermo-elastic phases P1 and P3, which are superimposed with each other (cf. FIG. 4B).

As is illustrated in FIG. 4B, the temperature $T_r$ of the stabilization annealing is beneficially equal to the set point temperature $T_t$ of the pre-stress annealing. The highest possible temperature is then chosen while avoiding plastic deformation of the layers.

In an alternative embodiment of the assembling method, the initial tensile stress $\sigma_i$ of the first and second metal layers is achieved during their respective deposition onto the first and second substrates, by controlling the deposition parameters such as the gas temperature or pressure in the deposition enclosure. Step S2 of stress adaptation is thereby no longer necessary. By way of example, document ["Residual stress, microstructure, and structure of tungsten thin films deposited by magnetron sputtering", Y. G. Shen et al., Journal of Applied Physics, vol. 87, p. 177, 2000] indicates that tungsten layers deposited by PVD can be tensile stressed by controlling argon pressure (and more particularly any inert gas) within the deposition enclosure.

Alternatively, the initial tensile stress $\sigma_i$ of the metal layers can be achieved during a plasma treatment or ion bombardment, subsequently to their deposition onto the substrates.

The values of tensile yield strength $\sigma_e$ and compressive yield strength $\sigma_p$ of the abovementioned different metals or metal alloys are well referenced in literature and are substantially identical between the configuration of thin layers (10 nm-5 μm) and in volume (layers with a thickness higher than 5 μm). The thermo-elastic coefficients $\gamma$ of course depend on the metal chosen, but also on the nature of the substrates on which the metal layers are deposited. If the thermo-elastic coefficient $\gamma$ is not given in literature, it can be readily calculated from the expansion coefficients of the different materials and the geometric dimensions of the configuration which is investigated. It can be also easily obtained from measurements at two temperatures (for example at ambient temperature and at 100° C.).

The table below gives by way of example the values of these physical quantities for several metals commonly used in microelectronics: copper, tungsten and aluminum. In the case of copper, several types of substrates have been considered: silicon, silicon carbide (SiC) and indium phosphide (InP).

| Substrate | Silicon | Silicon | Silicon | SiC | InP |
|---|---|---|---|---|---|
| Thin layer | W | Al | Cu | Cu | Cu |
| Depositing mode | CVD | PVD | PVD/ECD | PVD/ECD | PVD/ECD |
| $\sigma_e$ (Mpa) | 1200 | 120 | 300 | 300 | 300 |
| $\sigma_p$ (Mpa) | −120 | −50 | −150 | −150 | −150 |
| $\gamma$ (Mpa/K) | −0.6 | −2.1 | −1.2 | −1.8 | −1.6 |
| $T_l$ (° C.) | 2200 | 101 | 388 | 270 | 301 |

The table also gives, for each substrate, metal and depositing mode combination, the temperature limit $T_1$ of the pre-stressing treatment (and thus of the stabilization annealing) calculated from the elasticity tensile stress $\sigma_e$ and the thermo-elastic coefficient $\gamma$.

Both substrates to be assembled are, in an embodiment, comprised of the same materials (silicon, SiC, InP, sapphire . . . ) to facilitate the determination of the thermo-elastic coefficient $\gamma$ of the metal layers. For the same reason, the metal layers are beneficially of the same thickness (between 10 nm and 5 μm).

An exemplary embodiment of the assembling method will now be described in reference of FIG. 5A.

In step S1, the first and second substrates 10a-10b of silicon, with a 200 mm diameter, are respectively covered with a first barrier layer 11a and a second barrier layer 11b of titanium nitride (TiN), and then a first layer 12a and a second layer 12b of copper. The titanium nitride layers 11a-11b, with a 20 nm thickness, and the copper layers 12a-12b, with a 1 μm thickness, are obtained by physical vapor deposition (PVD). They cover an entire face of the substrates 10a-10b. The TiN and copper depositions on the substrates 10a-10b are successively made in the same piece of equipment, without placing again the substrates in the open air.

The physical vapor deposition is performed at ambient temperature (25° C.) under an argon atmosphere (pressure=8.5 mTorr), at a bias voltage of about 5 kV.

At the end of deposition, the copper layers 12a and 12b are quasi-relaxed ($\sigma_i$<20 MPa in tension).

In S2, each substrate 10a-10b (covered with the TiN and copper layers) is subjected to a heat treatment under secondary vacuum for 10 h at 400° C. After cooling, the tensile stress of the copper layers 12a-12b is about 250 MPa (±50 MPa).

Then, the free face of the copper layers 12a-12b is polished and washed (step S3) in order to decrease surface roughness. This roughness switches from a root mean square (RMS) value of 5 nm to a value lower than 0.5 nm RMS. The substrates are then assembled by direct bonding (step S4) by contacting the polished surfaces of the copper layers 12a-12b. A bonding leading end is manually initiated by localized pressure (for example with a stylus), and then is propagated to the entire bonding surface of the copper layers 12a-12b.

The assembly of the substrates 10a-10, the TiN layers 11a-11b and the copper layers 12a-12b is symmetric relative to the bonding interface I located between both copper layers 12a-12b, because the substrates 10a et 10b are of the same thickness (as well as the TiN layers 11a-11b and the copper layers 12a-12b).

Finally, the assembly is annealed for 2 h at 300° C. after a temperature rise of 1° C./min. This stabilization annealing enables bonding to be made definitive.

Figure 5A:
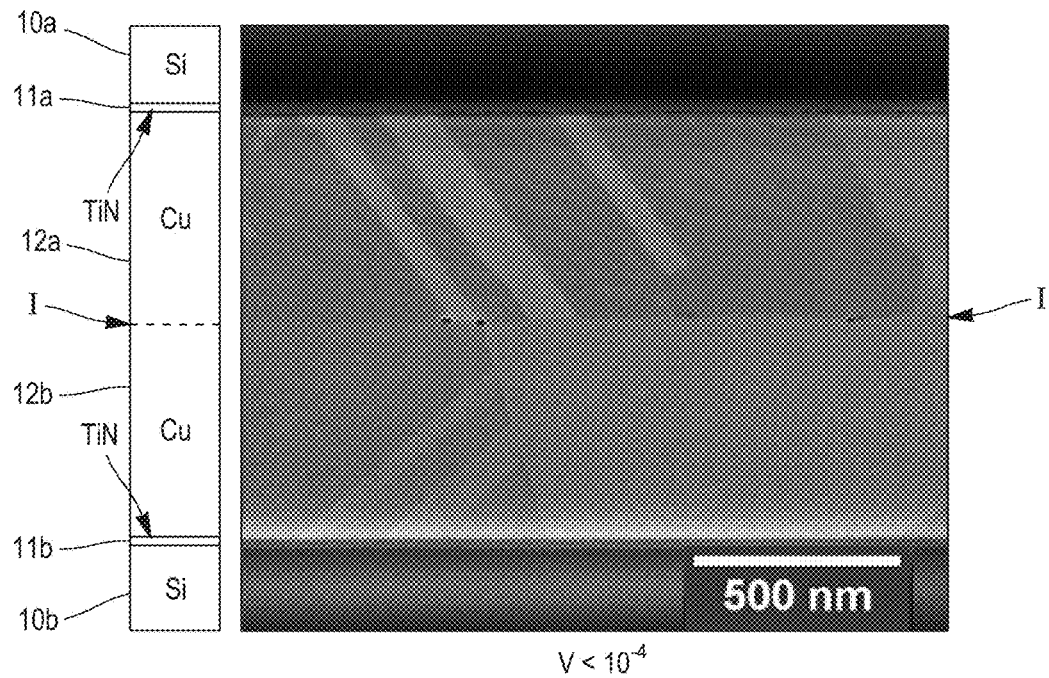
FIGS. 5A and 5B show a cross-section view of two assemblies of substrates, respectively obtained with the method according to an embodiment of the invention and with a method according to prior art.

In addition to the schematic representation (on the left), FIG. 5A shows (on the right) a cross-section taken with a scanning electron microscope of the assembly of both substrates 10a-10b. The volume fraction V of the defects (herein voids) at the bonding interface and the interfaces between the copper layers 12a-12b and the TiN layers 11a-11b is lower than $10^{-4}$. The volume fraction V of the defects is defined as the defect volumes to the total copper volume (layer 12a+layer 12b).

Figure 5B:
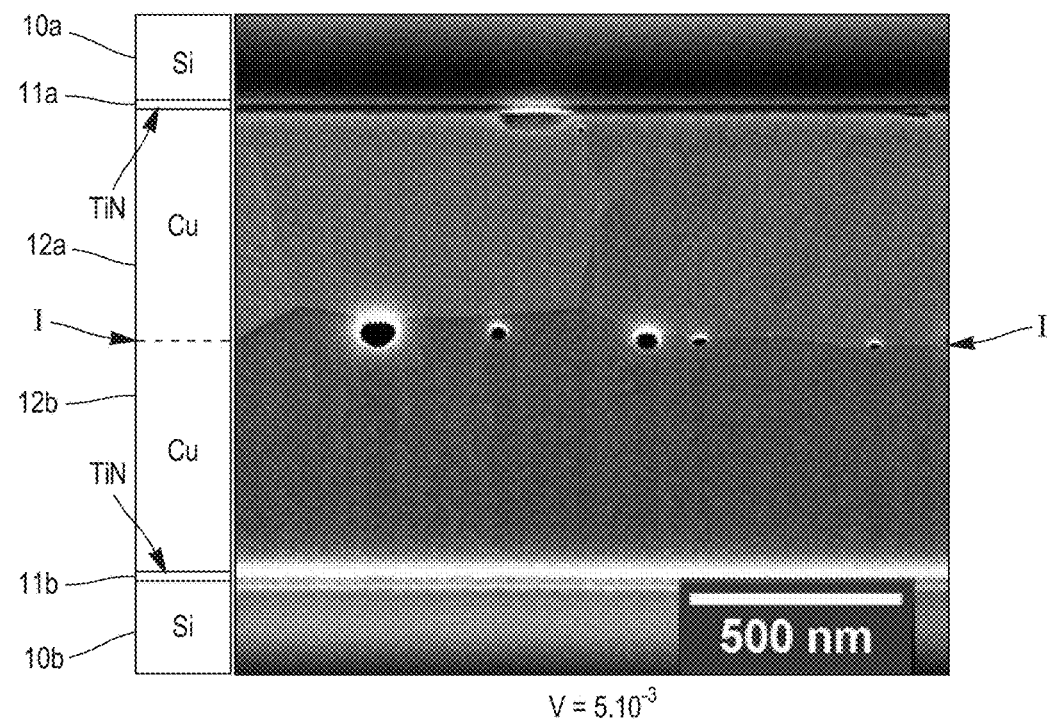

By way of comparison, FIG. 4B shows a SEM cross-section of an assembly of a same structure (substrates 10a-10b/TiN layers 11a-11b/copper layers 12a-12b), obtained by the direct bonding method of prior art. The defects at the interfaces are not only higher in number, but also more voluminous. The volume fraction V of the defects in the assembly of FIG. 5B is about $5.10^{-3}$, that is an order of magnitude higher than the volume fraction V of the assembly of FIG. 5A. The assembling method according to the invention thus enables the volume of the defects to be dramatically decreased in the copper layers.

The invention claimed is:

1. A method for assembling a first substrate and a second substrate by a metal-metal direct bonding, comprising:
   providing a first layer of a metal at a surface of the first substrate and a second layer of said metal at a surface of the second substrate, the first and second metal layers having a tensile stress comprised between 30% and 100% of the tensile yield strength of said metal thereby forming a first tensile stressed metal layer at the surface of the first substrate and a second tensile stressed metal layer at the surface of the second substrate;
   bonding the first substrate with the second substrates at a bonding interface by directly contacting the first and second tensile stressed metal layers;
   after said bonding, subjecting first and second substrates to a stabilization annealing at a temperature lower than or equal to a temperature threshold, wherein the temperature threshold is such that the first and second tensile stressed metal layers are plastically compressively deformed above the temperature threshold.

2. The method according to claim 1, comprising determining said temperature threshold from the tensile stress of the first and second metal layers and the thermo-elastic coefficient of said metal.

3. The method according to claim 1, wherein the providing comprises depositing the first metal layer onto a face of the first substrate and the second metal layer onto a face of the second substrate.

4. The method according to claim 3, wherein the tensile stress of the first and second metal layers is obtained during the depositing.

5. The method according to claim 1, wherein the tensile stress of the first and second metal layers is obtained after deposition of the first metal layer onto a face of the first substrate and of the second metal layer onto a face of the second metal layer during a stress adaptation step.

6. The method according to claim 5, wherein the stress adaptation step is a step of plasma treatment or ion bombardment.

7. The method according to claim 5, wherein the stress adaptation step comprises a heat treatment followed by a cooling, the heat treatment being performed at a temperature lower than or equal to a temperature limit beyond which the first and second metal layers are plastically tensile deformed by cooling, and wherein the temperature of the heat treatment sets the temperature threshold of the stabilization annealing.

8. The method according to claim 7, wherein the cooling is performed down to an ambient temperature.

9. The method according to claim 7, wherein the temperature of the stabilization annealing is equal to the temperature of the heat treatment.

10. The method according to claim 1, wherein the bonding of the first substrate with the second substrates is performed under ambient air.

11. The method according to claim 1, wherein the first and second substrates are comprised of identical materials.

12. The method according to claim 1, wherein the first and second substrates are made of silicon and the first and second metal layers are made of copper.

13. The method according to claim 1, wherein the first and second metal layers have a thickness comprised between 10 nm and 5 µm.

14. The method according to claim 1, further comprising, before bonding the first substrate with the second substrates, preparing the surface of the first and second metal layers.

15. The method according to claim 1, wherein the first substrate comprises a first barrier layer and the second substrate comprises a second barrier layer such that the first metal layer is formed on the first barrier layer and the second metal layer is formed on the second barrier layer.

16. The method according to claim 1, wherein each of the first and second barrier layers is a titanium nitride layer.

\* \* \* \* \*